United States Patent [19]

Valeri et al.

[11] Patent Number: 4,811,063
[45] Date of Patent: * Mar. 7, 1989

[54] JMOS TRANSISTOR UTILIZING POLYSILICON SINKS

[75] Inventors: Stephen J. Valeri, Warren; Kailash C. Jain, Sterling Heights; Bernard A. MacIver, Lathrup Village, all of Mich.

[73] Assignee: General Motors Corporation, Detroit, Mich.

[ * ] Notice: The portion of the term of this patent subsequent to May 24, 2005 has been disclaimed.

[21] Appl. No.: 110,453

[22] Filed: Oct. 20, 1987

[51] Int. Cl.$^4$ .................. H01L 29/78; H01L 29/80
[52] U.S. Cl. .................. 357/22; 357/23.4; 357/23.7; 357/59
[58] Field of Search .................. 357/23.4, 23.7, 22, 357/59

[56] References Cited

U.S. PATENT DOCUMENTS

| | | | |
|---|---|---|---|
| 4,259,681 | 3/1981 | Nishizawa | 357/92 |
| 4,470,059 | 9/1984 | Nishizawa et al. | 357/23.4 |
| 4,543,595 | 9/1985 | Vora | 357/59 A |
| 4,611,220 | 9/1986 | MacIver | 357/23.7 |
| 4,641,164 | 3/1987 | Dolny et al. | 357/23.4 |
| 4,644,386 | 2/1987 | Nishizawa et al. | 357/23.4 |
| 4,658,378 | 4/1987 | Bourassa | 357/59 A |
| 4,746,960 | 5/1988 | Valeri et al. | 357/23.7 |

Primary Examiner—Eugene R. LaRoche
Assistant Examiner—Michael B. Shingleton
Attorney, Agent, or Firm—Robert J. Wallace

[57] ABSTRACT

JMOS depletion mode transistors include back-to-back junctions in the doped polysilicon layer that serves as the gate. The polysilicon layer includes a first region of the same conductivity type as the channel in contact with the channel, and a second region, of the same conductivity type as the channel and to which the gate potential is applied, spaced apart by a region of the opposite conductivity type that serves as a sink for minority carriers in the channel. Both buried oxide layer and recessed gate JMOS transistors are included.

15 Claims, 5 Drawing Sheets

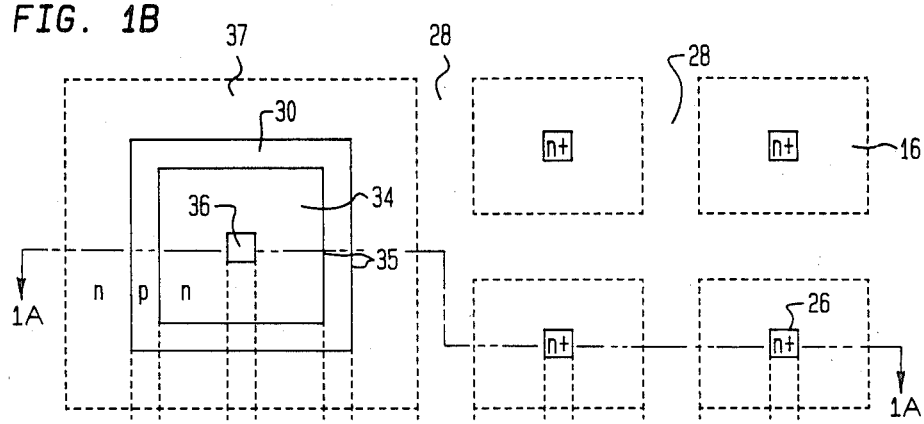
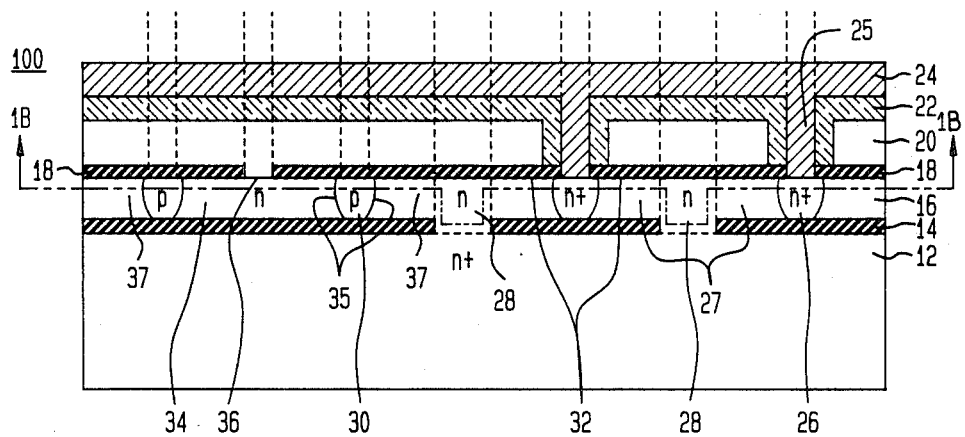

FIG. 3B
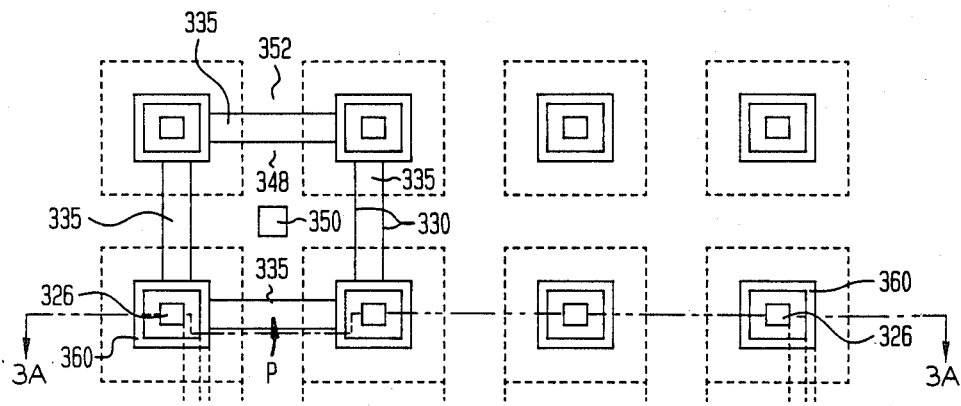
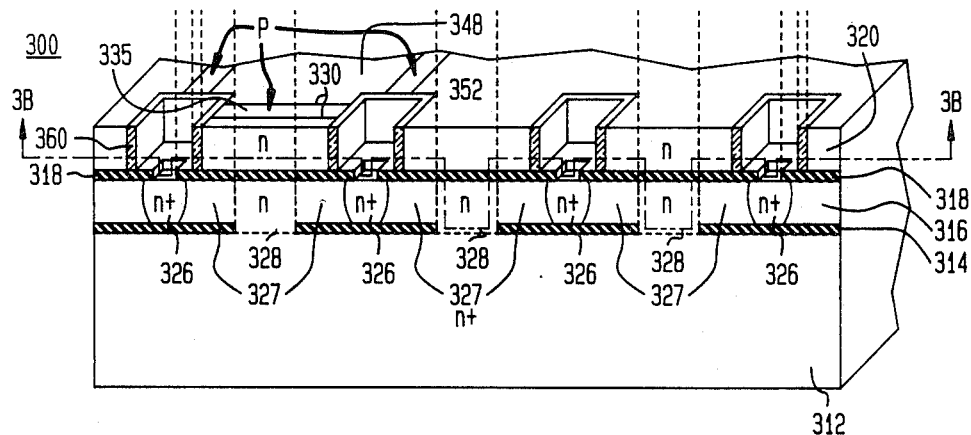
FIG. 3A

JMOS TRANSISTOR UTILIZING POLYSILICON SINKS

FIELD OF THE INVENTION

This invention relates to semiconductive devices and more particularly to devices of the kind now described as J-MOSFETs or JMOS transistors.

BACKGROUND OF THE INVENTION

In U.S. Pat. No. 4,611,220, issued on Sept. 6, 1986, there is described an MOS transistor of the depletion mode type that features a small island of opposite conductivity type located in the normally conducting channel and maintained essentially at the potential of the gate electrode. The island serves as a sink to collect minority charge carriers that are attracted to the interface between the channel and the gate oxide when a voltage is applied to the gate electrode to deplete the channel of majority carries. Such minority charges, if not collected, make it difficult to turn off the transistor completely. Such a transistor has been described as a junction-metal-oxide-silicon field effect transistor, or more simply as a JMOS transistor.

In our application Ser. No. 077,742, filed July 27, 1987, and assigned to the same assignee as the instant application, now U.S. Pat. No. 4,746,960, there are described various improved forms of J-MOSFETs that include a two-dimensional array of cells sharing a common source electrode and a common drain electrode that are on opposite surfaces of a silicon chip. The chip includes an apertured buried oxide layer that divides it between a monocrystalline substrate portion and an epitaxial layer portion in which is formed a common channel layer divided into a plurality of segments, each controlled by a separate segment of a common gate electrode. Included in the common channel are a plurality of islands of opposite conductivity type that form back-to-back PN junctions for collection of charge carriers that tend to collect at the channel-gate oxide interface, as mentioned above. In such a structure, the back-to-back junctions are in the epitaxial silicon layer and so reduce the portion of the layer that can be used effectively as a channel for signal charge flow between source and drain.

It is desirable to form a J-MOSFET that uses its channel more efficiently.

Moreover, the inclusion of a buried oxide layer in the earlier form makes for relatively complex processing. It is therefore desirable in some instances to eliminate the need for such a buried oxide layer. To this end, the invention can be further extended to improve the recessed-gate JMOS transistor described in our earlier application Serial No. 923,583, filed Oct. 27, 1986, now U.S. Pat. No. 4,769,695, and thereby to provide an embodiment that does not include include a buried oxide layer.

SUMMARY OF THE INVENTION

The present invention is directed to a JMOS transistor that uses as the gate a doped polysilicon layer in which back-to-back junctions are included to collect the minority carriers that tend to build up at the interface of the channel and the gate oxide, when the gate electrode is biased to deplete the channel of its majority carriers for turning off conduction in the channel. Such back-to-back junctions are included in the layer to separate portions in direct contact with the channel from portions to which the operating gate potentials are applied.

Various embodiments are described below including buried oxide JMOS transistors and recessed-gate JMOS transistors.

The invention will be better understood from the following detailed description taken in conjunction with the accompanying drawings.

BRIEF DESCRIPTION OF THE DRAWINGS

FIGS. 1A and 1B show cross-sectional and modified plan views, respectively, of the buried oxide layer JMOS transistor described in our copending application, in which the collectors of minority carriers are located in the channel of the transistor;

FIGS. 3A and 3B show similar views of an alternative embodiment of a buried-oxide JMOS transistor in accordance with the present invention;

Figure 2B:
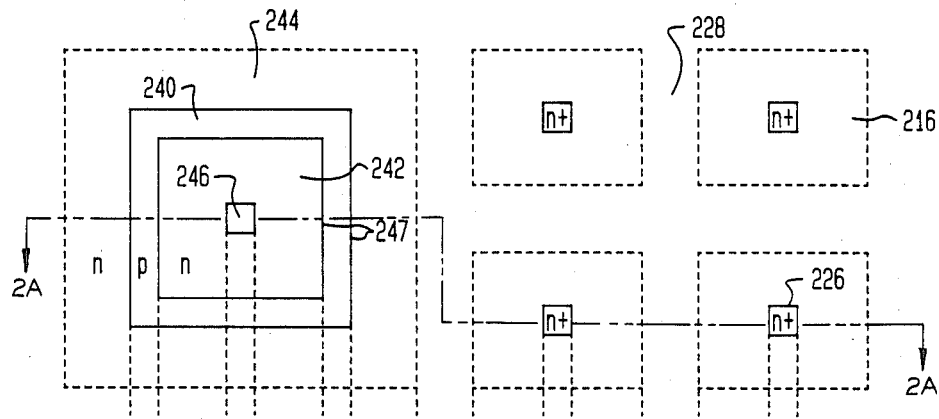
FIGS. 2A and 2B show similar views for a buried oxide layer JMOS transistor in which the collectors of minority carriers are located in a separate polysilicon layer outside the channel in accordance with the present invention.

It is to be noted that the drawings are not to scale since the vertical dimensions generally are much smaller than the horizontal dimensions.

DETAILED DESCRIPTION

Referring now to FIGS. 1A and 1B, there is shown a limited portion of a buried oxide layer J-MOSFET 100 of the kind described in our first-mentioned copending application. FIG. 1A shows a cross-sectional view of J-MOSFET 100 and FIG. 1B shows a plan view of various features of J-MOSFET 100 along dashed line 1B—1B of FIG. 1A. A first set of dashed vertical lines extends upward from portions of FIG. 1A and a corresponding second set of dashed vertical lines extends downward from FIG. 1B. If these two sets of dashed lines are extended so as to intersect, then they serve as reference lines which show where features shown in FIG. 1B exist in portions of J-MOSFET 100 of FIG. 1A. The J-MOSFET 100 comprises a monocrystalline silicon chip that includes the bulk N'0 type substrate 12 that serves as the source of the transistor and that is separated from the rest of the chip by a patterned layer 14 of silicon oxide, typically silicon dioxide, buried in the interior of the chip. Overlying the buried layer 14 is a N-type epitaxial silicon layer 16 in which is formed the channel of the transistor. Typically the channel includes many segments of which only one complete segment is shown here. Overlying the epitaxial layer 16 is the gate oxide layer 18. Overlying the gate oxide layer 18 is layer 20 of polysilicon, doped N-type to be conductive, that serves as the gate electrode, or gate, of the transistor. Overlying the gate is an insulating layer 22, typically of a phosphorus-rich glass that isolates the gate 20 from the overlying conductive layer 24, typically of aluminum, from which depend projections 25 that pass through to form low resistance connections to spaced localized N+ type regions 26 in the epitaxial layer 16.

Figure 2A:
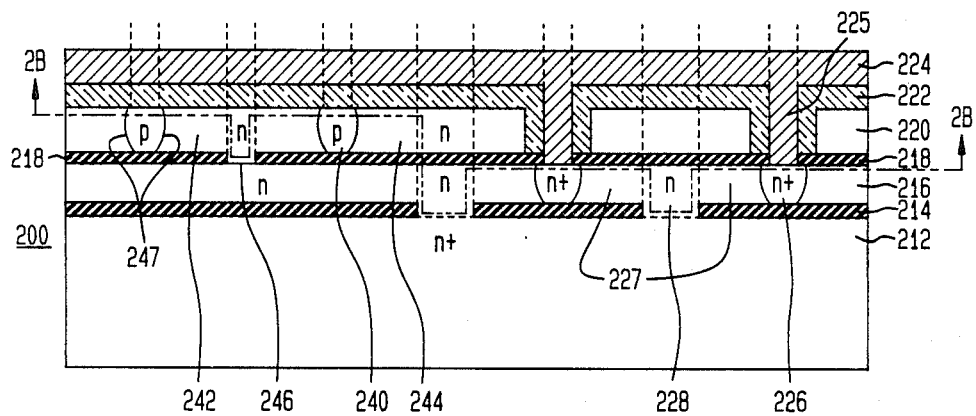

Regions 26 serve as the drains of the transistor and define therebetween channel segments 27 that extend through apertures 28 in the buried oxide layer 14 to merge with the N+ type source region 12. On the left side of the chip, the epitaxial layer 16 includes the P-type annulus 30, that provides back-to-back junctions 35, as better seen in FIG. 1B. These serve to collect holes that tend to accumulate at the channel-oxide interface 32, as the gate is biased negatively to deplete the channel of electrons to cut off current flow between the source and drain regions of the transistor. The annulus 30 is surrounded by N-type portion 37 that is directly connected to the active channel region of the epitaxial layer for the initial collection of holes. The annulus 30 surrounds an N-type portion 34 of the epitaxial layer 16 that is connected directly, by way of aperture 36 in the gate oxide layer 18, to the common polysilicon layer 20 that serves as the segmented gate of the transistor. As a result portion 34 is always maintained at the gate potential and in this way appropriately biases the back-to-back junctions 35 formed by annulus 30 in the epitaxial layer 16 for the collection of holes in the channel when the gate is biased negatively. The manner of applying the various operating potentials to the transistor is straight forward and so is not shown. Referring now to FIGS. 2A and 2B, there is shown a J-MOSFET 200 in accordance with an illustrative embodiment of the present invention. FIG. 2A shows a cross sectional view of J-MOSFET 200 and FIG. 2B shows a plan view of various features of J-MOSFET 200, along dashed line 2B—2B of FIG. 2A. A first set of dashed vertical lines extends downward from FIG. 2B and a corresponding second set of dashed lines extends upward from FIG. 2A. If these two sets of lines are extended so as to intersect, then they serve as reference lines which show where the features shown in FIG. 2B exist in portions of J-MOSFET 200 of FIG. 2A. In FIGS. 2A and 2B, elements corresponding or similar to those of the J-MOSFET 100 of FIGS. 1A and 1B have been given the reference numeral used in FIGS. 1A and 1B incremented by 200. There will not be repeated the description of the active portion on the right side of the chip where the epitaxial layer 216 is free of any P-type sink, since this active portion is unchanged. However, where in J-MOSFET 100 the epitaxial layer 16 had included a P-type annulus 30 sink, in J-MOSFET 200 in epitaxial layer 216, the sink is eliminated. Instead polysilicon layer 220, that serves as the gate, and whose bulk is doped N-type, is provided with an annular region 240 that is doped to be P-type. Region 240 encloses and isolates an N-type region 242 and in turn is enclosed within the N-type region 244. As a consequence, back-to-back junctions 247 are formed in the polysilicon layer 220. The gate oxide layer 218 includes an aperture 246 that permits the inner polysilicon region 242 to make contact with the epitaxial silicon channel layer 216.

The annular polysilicon region 240 of J-MOSFET 200 serves the same role as the annular epitaxial silicon region 30 in J-MOSFET 100 of FIGS. 1A and 1B. To this end, it provides back-to-back junctions 247 that serve to collect the holes that tend to accumulate at the interface between the channel layer 216 and the gate oxide layer 218 when the layer 220 is at a negative potential to deplete the electrons in the channel of the transistor.

As in the J-MOSFET 100 of FIGS. 1A and 1B, the polysilicon layer 220 serves as the gate and is provided with a terminal (not shown) to which the operating gate voltages are applied. Moreover, analogous to the role of inner N-type region 36 in J-MOSFET 100, in J-MOSFET 200, outer N-type region 244 is maintained by means not shown at the gate operating potentials to bias the junctions 247. As previously mentioned, inner region 242 is directly connected to the epitaxial layer 216 by way of aperture 246 for the initial collection of the holes from the channel.

Referring now to FIGS. 3A and 3B, there is shown as an alternative embodiment in accordance with the present invention, a J-MOSFET 300 that further improves on the efficient use of the surface area of a silicon chip. FIG. 3A shows a cross-sectional view of J-MOSFET 300 and FIG. 3B shows a plane view of various features of J-MOSFET 200 along dashed line 3B—3B of FIG. 3A. In FIGS. 3A and 3B, elements corresponding or similar to those of J-MOSFET 200 of FIGS. 2A and 2B have been given the reference numerical used in FIGS. 2A and 2B incremented by 100. A first set of dashed vertical lines extends upward from FIG. 2A and a corresponding second set of vertical lines extends downward from FIG. 2B. If these two sets of lines are extended so as to intersect, then they serve as reference lines which show where features shown in FIG. 3B exist in portions of J-MOSFET 300 of FIG. 3A. As the J-MOSFET 200 of FIGS. 2A and 2B, J-MOSFET 300 uses a silicon chip that includes a patterned buried oxide layer 314. This layer separates an N+ type bulk 312 that serves as the source from an epitaxial layer 316 that provides the segmented channels 327 that extend through apertures 328 in the buried oxide layer 314 to merge with N+ type source region 312. In this embodiment, the epitaxial layer 316 is also free of PN junctions and so largely useful as an active channel. Overlying the epitaxial layer 316, is the gate oxide layer 318, apertured as before, to permit drain electrodes (not shown here) to make direct connection to the N-type drain regions 326 in the epitaxial layer 316. Overlying the gate oxide layer 318 is the polysilicon layer 320 which, as previously, is provided with back-to-back junctions 330. However, in this embodiment P-type strips 335 used to form the back-to-back junctions 330 are positioned in a manner not to interrupt the regularity of the cell structure of the transistor, but are positioned over active regions of the channel, as best seen in FIG. 3B. To this end, the P-type strips 335 extend the full depth of the polysilicon layer 320 between a group of four drain electrode openings to isolate completely an N-type region 348 of the polysilicon layer 320 from the rest of an N-type portion 352 of layer 320. The role of region 348 corresponds to that of region 242 in J-MOSFET 200 shown in FIGS. 2A and 2B. To this end, this N-type region 348 is provided with a direct connection to the underlying epitaxial layer 316 by way of an opening 350 in the gate oxide layer 318 in analogous fashion of opening 246 in J-MOSFET 200. The P-type strips 335 in turn are surrounded by N-type portions of the polysilicon layer that are maintained at the gate potential, so that the back-to-back junctions 330 formed by the strips 335 are appropriately biased for their collection role. The polysilicon layer 320 is apertured over each N+ type drain region 326 to let pass drain electrode projections (not shown) that correspond to drain electrode projection 225 shown in FIG. 2A that passes through, in turn, glass layer 222, polysilicon layer 220 and oxide layer 218 to contact N+ type drain region 226. In J-MOSFET 300 a phosphorus glass layer 360 also serves to isolate the drain electrode (not shown) from the P-type strips 335 and helps in the isolation of regions 348.

In J-MOSFET 300 drain electrodes may be distributed in a two dimensional array over the entire surface of the chip, as shown in the plan view, while the polysilicon layer includes fewer pairs of back-to-back junctions to serve for collection of holes from the channel.

The principles of the invention may also be extended to the recessed gate JMOS transistor disclosed in our aforementioned application.

Figure 4:
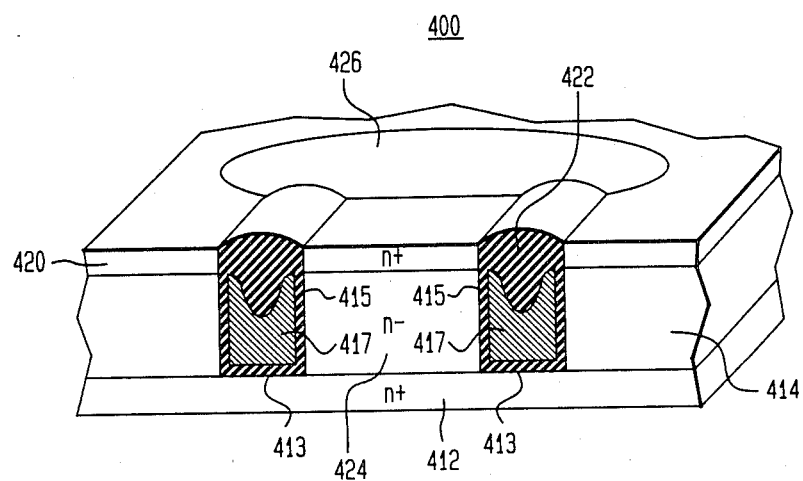
FIG. 4 shows in perspective a recessed-gate JMOS of the kind described in our copending application.

Referring now to FIG. 4, there is shown schematically the basic elements of such a recessed gate transistor 400. An N+ type substrate 412 serves, as before, as the source of the transistor and an N-type epitaxial layer 414 lies over the substrate 412. A number of elongated trenches or grooves 413 are formed in the epitaxial layer. The trench walls are oxidized to form a silicon oxide gate layer 415 and the trenches are then filled with doped polysilicon 417 that serves as a segmented gate for each trench. A portion of top surface of the silicon chip includes N+ type regions 420 that serve as the drain of the transistor. The N-type regions 424 between the trenches serve as the channels between source 412 and drain 420. An oxide layer 422 serves to isolate the surface drain region from the polysilicon in the trenches. Over a portion of the top surface of the chip, isolated by an underlying layer of silicon oxide (not shown), is a doped polysilicon runner or gate pad 426 that connects by way of openings in the oxide layers (not seen) directly to the polysilicon 417 in the trenches. A metal layer (not shown) is provided over a portion of such pad 426 to serve as the electrical terminal for the application of gate operating potentials.

Figure 5:
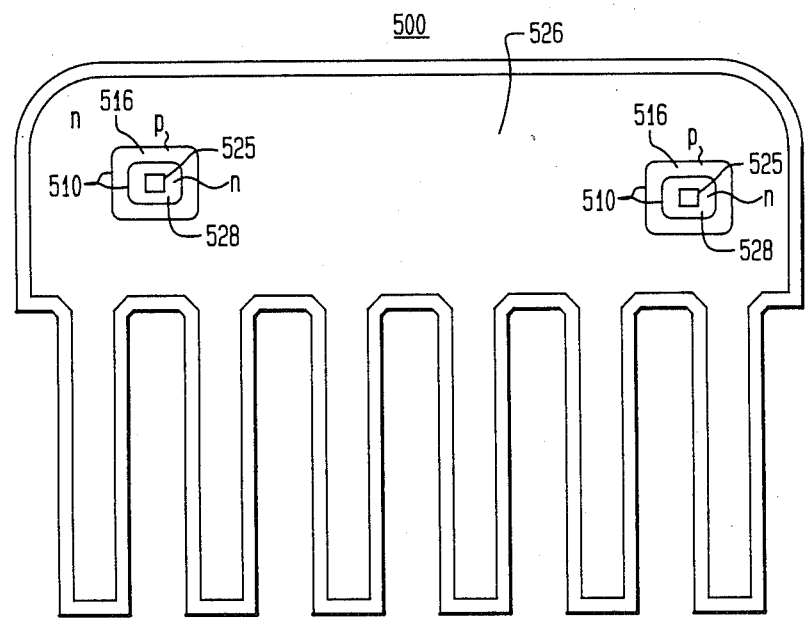
FIG. 5 is a schematic plan view of a form of the recessed gate JMOS transistor of FIG. 4 modified in accordance with the present invention.

Referring now to FIG. 5, there is shown in plan view a recessed gate transistor 500 which in all respects save one resembles that shown as transistor 400 in FIG. 4, and so it will not be described in detail except for the one difference. In transistor 500, the polysilicon pad 526, corresponding to pad 426 of transistor 400, is modified to include back-to-back pairs of PN junctions 510 to serve as collector of holes from the channel, as is characteristic of the present invention.

Figure 6:
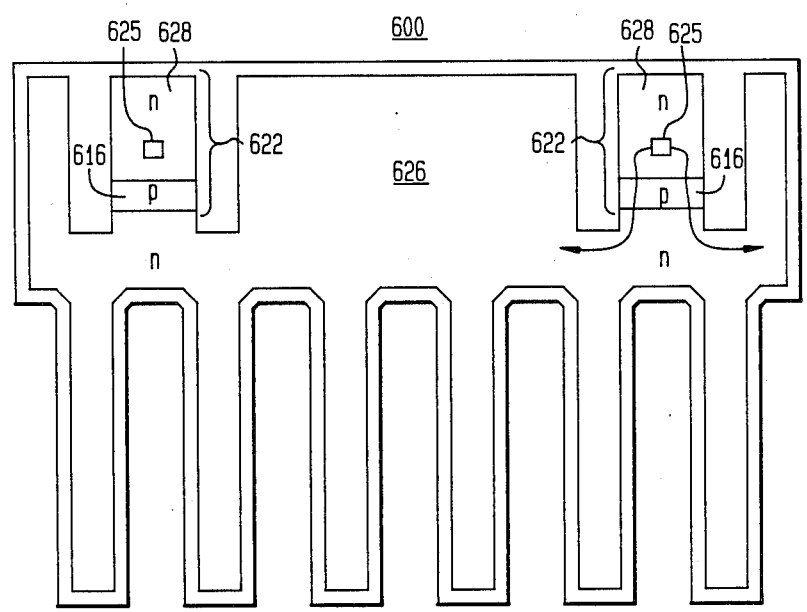
FIG. 6 is a schematic plan view of an alternative form of the recessed gate JMOS transistor of FIG. 4 in accordance with the present invention.

To this end, the pad 526, whose bulk is N-type is provided with a P-type annulus 516 that extends completely through the polysilicon layer that forms the pad to the underlying oxide layer that separates the pad from the silicon chip. The annulus encloses N-type portion 528 which contacts directly a region of the underlying epitaxial layer that serves as the channel by way of an opening 525 in the underlying oxide. In this case, the surface of the chip under the pad desirably is left N-and not doped to be N+, as is the drain portion. At such region, the chip is essentially an extension of the channel region of the transistor so that this portion 528 can serve in the manner of portion 242 shown in FIG. 2. The junctions 510 will be biased by the operating gate potential applied to the bulk of the polysilicon pad. As shown, a number of these P-type annular collectors 516 may be included spaced apart along the pad. Referring now to FIG. 6, there is shown in recessed-gate transistor 600 an alternative arrangement for providing the back-to-back junctions. As seen, the polysilicon pad 626 is patterned to include elongated finger portions 622 which are provided with strip P-type regions 616 which, as before, penetrate to the surface oxide (not shown) underlying the polysilicon pad and serve to isolate N-type portions 628 from the bulk of the pad. Again there are provided openings 625 in the underlying oxide (not shown) where the N-type portions 628 connect to the underlying channel layer. By this expedient there is simplified the geometry of the P-type sink, reducing the area, and hence parasitic capacitance, of the back-to-back junctions it forms. In other respects, transistor 600 resembles transistor 500.

The particular embodiments described are readily formed by the various techniques presently available for fabricating integrated circuit devices.

It should be apparent from the variety of embodiments described that the principles of the invention are broadly applicable to JMOS transistors and that various other embodiment may be devised consistent with the principles involved.

In particular, in some instances it may prove preferable to collect the minority carriers from the channel simply by localized islands of conductivity type opposite that of the channel. In this case, appropriate voltages are applied directly to the islands. The use of discrete islands for collection is described in my first-mentioned issued patent. Finally, it should be recognized that complementary forms of the transistors shown can be formed by reversing the conductivity-type of the various regions of the transistors. Additionally, as is well known, the roles of drain and source are readily reversed by a reversal of the operating potentials.

The embodiments of the invention in which an exclusive property or privilege is claimed are defined as follows:

1. A JMOS transistor including a monocrystalline silicon chip within which are formed source and drain regions of one conductivity type spaced apart along a channel of the one conductivity type, and a polysilicon layer including a first portion positioned along the channel and insulated therefrom for serving as the gate for depleting the channel and a second portion that includes means for collecting minority carriers from the channel when the first portion is at a gate potential for depleting the channel.

2. The JMOS transistor of claim 1 in which the means for collecting the minority carriers are back-to-back P-N junctions in the second portion of the polysilicon layer.

3. The JMOS transistors of claim 2 in which the back-to-back junctions are formed by a region, which is of conductivity type opposite said one conductivity type, and is enclosed by and encloses regions of the one conductivity type.

4. The JMOS transistor of claim 3 in which the region of one conductivity type that is enclosed by said region of opposite conductivity type is directly connected to the channel and the enclosing region is adapted to be maintained at the gate potential of the transistor.

5. The JMOS transistor of claim 4 in which the region of opposite conductivity type is annular and encloses said region of opposite conductivity type that is connected to the channel.

6. The JMOS transistor of claim 2 in which strip regions of opposite conductivity divide the second portion of the polysilicon layer into two regions of the one conductivity type, only one of which is in direct connection with the channel.

7. The JMOS transistor of claim 5 in which the annular region overlies an inactive portion of the channel.

8. The JMOS transistor of claim 5 in which the annular region overlies an active portion of the channel.

9. The JMOS transistor of claim 1 in which the silicon chip includes a pattern buried oxide layer and the source and drain regions are on opposite sides of said patterned buried oxide layer and are connected by way of channel regions through the pattern in the buried oxide layer.

10. The JMOS transistor of claim 1 in which the silicon chip includes a plurality of trenches and the source and drain regions are at the top and bottom of the trenches, the first portion of the polysilicon layer is included within said trenches for forming a polysilicon gate, and the second portion of the polysilicon layer is an extension outside the trenches.

11. The JMOS transistor of claim 10 in which the second portion of the polysilicon layer overlies a portion of the silicon chip and is spaced therefrom by an insulating layer, and the means for collecting minority carriers from the channel includes an annular region which is of conductivity type opposite that of the channel and encloses a region of the conductivity type of the channel that connects to the channel by way of an opening in the insulating layer.

12. A buried oxide layer JMOS transistor comprising;
a monocrystalline silicon chip of one conductivity type including a patterned buried layer of silicon oxide for dividing the chip into source portions and into drain portions interconnected by channel portions extending through apertures in the buried oxide layer;
an insulating gate oxide layer over the channel portions;
and a polysilicon layer extending in part over the gate oxide layer along said channel portions for serving as gate electrodes and including means for collecting minority carriers that tend to accumulate at the gate oxide interface with said channel portions.

13. The JMOS transistor of claim 12 in which the means for collecting comprises an annulus of the opposite conductivity type positioned to isolate a portion of the polysilicon layer that is maintained at a potential applied to the channel from a portion of the polysilicon layer that is maintained at a potential applied to the gate.

14. The buried oxide layer transistor of claim 12 in which the means for collecting are a plurality of discrete strips of opposite conductivity type.

15. A recessed gate JMOS transistor comprising:
a monocrystalline silicon chip of one conductivity type which includes a plurality of regularly spaced trenches, each of which is lined with a layer of gate oxide and filled with a layer of polycrystalline silicon, for defining therebetween channels extending between source and drain regions; and
means for collecting minority carriers from the channels including a layer of polycrystalline silicon extending over a surface portion of the silicon chip and insulated therefore, that includes a region of one conductivity type separating two portions of the opposite conductivity type, of which one portion is maintained at the potential of the channel and the other is maintained at the potential of the polysilicon layer filling the trenches.

* * * * *